(12) United States Patent
Nakahashi

(10) Patent No.: US 8,373,329 B2
(45) Date of Patent: Feb. 12, 2013

(54) SURFACE ACOUSTIC WAVE DEVICE

(75) Inventor: Norihiko Nakahashi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/432,006

(22) Filed: Mar. 28, 2012

(65) Prior Publication Data
US 2012/0187799 A1    Jul. 26, 2012

Related U.S. Application Data

(63) Continuation of application No. PCT/JP2010/068315, filed on Oct. 19, 2010.

(30) Foreign Application Priority Data

Oct. 19, 2009 (JP) ................................. 2009-240202

(51) Int. Cl.
*H03H 9/25* (2006.01)
(52) U.S. Cl. ................ 310/313 B; 310/313 R; 310/363; 310/364
(58) Field of Classification Search .............. 310/313 R, 310/313 B, 363, 364
See application file for complete search history.

(56) References Cited

U.S. PATENT DOCUMENTS

| | | | |
|---|---|---|---|
| 6,657,366 B2* | 12/2003 | Watanabe et al. | 310/364 |
| 6,836,196 B2* | 12/2004 | Kadota et al. | 333/193 |
| 2001/0052736 A1 | 12/2001 | Iwamoto et al. | |
| 2007/0096592 A1* | 5/2007 | Kadota et al. | 310/313 A |
| 2007/0159026 A1* | 7/2007 | Kando | 310/313 D |
| 2008/0012450 A1* | 1/2008 | Meister et al. | 310/313 R |
| 2009/0174284 A1* | 7/2009 | Mimura et al. | 310/313 A |
| 2011/0050034 A1* | 3/2011 | Yamane | 310/313 C |

FOREIGN PATENT DOCUMENTS

| | | |
|---|---|---|
| JP | 2001-332953 A | 11/2001 |
| JP | 2004-228901 A | 8/2004 |
| JP | 2006-203839 A | 8/2006 |
| JP | 2006-295976 A | 10/2006 |
| JP | 2008-522514 A | 6/2008 |
| JP | 2008-235950 A | 10/2008 |
| WO | 2006/126327 A1 | 11/2006 |

OTHER PUBLICATIONS

Official Communication issued in International Patent Application No. PCT/JP2010/068315, mailed on Jan. 18, 2011.

* cited by examiner

*Primary Examiner* — J. San Martin
*Assistant Examiner* — Bryan Gordon
(74) *Attorney, Agent, or Firm* — Keating & Bennett, LLP

(57) ABSTRACT

A surface acoustic wave device includes an electrode and a dielectric layer laminated on a piezoelectric substrate, in which the electrode includes a first electrode film containing Pt, Au, Ag, or Cu and a second electrode film containing Al, the normalized film thickness h/λ of the first electrode film is about 0.005 or more and at most about 0.015 in the case of Pt, the normalized film thickness h/λ of the Al film is about 0.06 or more and at most about 0.185, and the normalized film thickness h/λ of the dielectric layer is about 0.2 or less.

12 Claims, 12 Drawing Sheets

SURFACE ACOUSTIC WAVE DEVICE

BACKGROUND OF THE INVENTION

1. Field of the Invention

The present invention relates to a surface acoustic wave device for use in a resonator, a band-pass filter, or other suitable component. More specifically, the present invention relates to a surface acoustic wave device in which an IDT electrode and a dielectric film are disposed on a piezoelectric substrate.

2. Description of the Related Art

Surface acoustic wave devices have been widely used as a resonator or a band-pass filter of communication apparatuses heretofore.

For example, the following Japanese Unexamined Patent Application Publication No. 2008-522514 discloses a surface acoustic wave device in which an IDT electrode and a dielectric film containing $SiO_2$ are laminated on a piezoelectric substrate. Japanese Unexamined Patent Application Publication No. 2008-522514 discloses that the temperature characteristics can be improved by forming the $SiO_2$ film so as to cover the IDT electrode to thereby reduce the absolute value of the frequency temperature coefficient TCF. Japanese Unexamined Patent Application Publication No. 2008-522514 also discloses that the IDT electrode has a structure in which various metal films are laminated, and therefore the reflection intensity of surface waves can be adjusted by controlling the film thickness of each metal film in a specific range. The film thickness of the dielectric film containing $SiO_2$ is about 20% to about 40% of the wavelength $\lambda$ of surface acoustic waves.

However, in the surface acoustic wave device of Japanese Unexamined Patent Application Publication No. 2008-522514, since the insertion loss is not low, it is required to further reduce the insertion loss. Moreover, the thickness of the dielectric film is relatively as thick as about 20% to about 40% of the wavelength. Therefore, the electromechanical coupling coefficient is not so high. When used as a band-pass filter, it has been difficult to broaden the bandwidth.

SUMMARY OF THE INVENTION

Preferred embodiments of the present invention provide a surface acoustic wave device capable of eliminating the above-described defects of the former technique and sufficiently reducing insertion loss.

A surface acoustic wave device according to a first preferred embodiment of the present invention includes a piezoelectric substrate, an IDT electrode disposed on the piezoelectric substrate and including a Pt film and an Al film laminated on the Pt film, and a dielectric layer arranged to cover the IDT electrode on the piezoelectric substrate. When the wavelength of a surface acoustic wave is defined as $\lambda$, the normalized film thickness $h/\lambda$ of the Al film is about $0.06 \leq h/\lambda \leq$ about 0.185, the normalized film thickness $h/\lambda$ of the Pt film is about $0.005 \leq h/\lambda \leq$ about 0.015, and the normalized film thickness $h/\lambda$ of the dielectric layer is the normalized film thickness of the IDT electrode $\leq h/\lambda \leq$ about 0.2.

A surface acoustic wave device according to a second preferred embodiment of the present invention includes a piezoelectric substrate, an IDT electrode disposed on the piezoelectric substrate and including an Au film and an Al film laminated on the Au film, and a dielectric layer arranged to cover the IDT electrode on the piezoelectric substrate. When the wavelength of a surface acoustic wave is defined as $\lambda$, the normalized film thickness $h/\lambda$ of the Al film is about $0.06 \leq h/\lambda \leq$ about 0.183, the normalized film thickness $h/\lambda$ of the Au film is about $0.0056 \leq h/\lambda \leq$ about 0.017, and the normalized film thickness $h/\lambda$ of the dielectric layer is the normalized film thickness of the IDT electrode $\leq h/\lambda \leq$ about 0.2.

A surface acoustic wave device according to a third preferred embodiment of the present invention includes a piezoelectric substrate, an IDT electrode disposed on the piezoelectric substrate and including an Ag film and an Al film laminated on the Ag film, and a dielectric layer arranged to cover the IDT electrode on the piezoelectric substrate. When the wavelength of a surface acoustic wave is defined as $\lambda$, the normalized film thickness $h/\lambda$ of the Al film is about $0.06 \leq h/\lambda \leq$ about 0.17, the normalized film thickness $h/\lambda$ of the Ag film is about $0.01 \leq h/\lambda \leq$ about 0.03, and the normalized film thickness $h/\lambda$ of the dielectric layer is the normalized film thickness of the IDT electrode $\leq h/\lambda \leq$ about 0.2.

A surface acoustic wave device according to a fourth preferred embodiment of the present invention includes a piezoelectric substrate, an IDT electrode disposed on the piezoelectric substrate and including a Cu film and an Al film laminated on the Cu film, and a dielectric layer arranged to cover the IDT electrode on the piezoelectric substrate. When the wavelength of a surface acoustic wave is defined as $\lambda$, the normalized film thickness $h/\lambda$ of the Al film is about $0.06 \leq h/\lambda \leq$ about 0.164, the normalized film thickness $h/\lambda$ of the Cu film is about $0.012 \leq h/\lambda \leq$ about 0.036, and the normalized film thickness $h/\lambda$ of the dielectric layer is the normalized film thickness of the IDT electrode $\leq h/\lambda \leq$ about 0.2.

In the surface acoustic wave devices according to various preferred embodiments of the present invention, it is preferable that the piezoelectric substrate contains $LiTaO_3$ and the dielectric layer contains a silicon oxide. In such a case, the absolute value of the frequency temperature coefficient can be made small, so that the temperature characteristics can be improved.

The cut angle of the $LiTaO_3$ is preferably in the range of about 36° to about 49°, for example. Therefore, the propagation loss can be further reduced. For example, when used as a band-pass filter, the filter property can be further improved.

According to the surface acoustic wave device according to the first preferred embodiment of the present invention, the IDT electrode in which the Pt film having the specific film thickness and the Al film having the specific film thickness are laminated is provided. Furthermore, the normalized film thickness of the dielectric layer is preferably within the specific range. Therefore, the electromechanical coupling coefficient $k^2$ can be sufficiently increased. For example, when used as a band-pass filter, an improvement of the filter property, particularly broadening of the bandwidth, can be achieved. In addition, the insertion loss can be sufficiently reduced and the reflection coefficient of the IDT electrode can be increased.

According to the surface acoustic wave device according to the second preferred embodiment of the present invention, the IDT electrode in which the Au film having the specific film thickness and the Al film having the specific film thickness are laminated is provided. Furthermore, the normalized film thickness of the dielectric layer is preferably within the specific range. Therefore, the electromechanical coupling coefficient $k^2$ can be sufficiently increased. For example, when used as a band-pass filter, an improvement of the filter property, particularly broadening of the bandwidth, can be achieved. In addition, the insertion loss can be sufficiently reduced and the reflection coefficient of the IDT electrode can be increased.

According to the surface acoustic wave device according to the third preferred embodiment of the present invention, the IDT electrode in which the Ag film having the specific film thickness and the Al film having the specific film thickness are laminated is provided. Furthermore, the normalized film thickness of the dielectric layer is preferably within the specific range. Therefore, the electromechanical coupling coefficient $k^2$ can be sufficiently increased. For example, when used as a band-pass filter, an improvement of the filter property, particularly broadening of the bandwidth can be achieved. In addition, the insertion loss can be sufficiently reduced and the reflection coefficient of the IDT electrode can be increased.

According to the surface acoustic wave device according to the fourth preferred embodiment of the present invention, the IDT electrode in which the Cu film having the specific film thickness and the Al film having the specific film thickness are laminated is provided. Furthermore, the normalized film thickness of the dielectric layer is preferably controlled to be in the specific range. Therefore, the electromechanical coupling coefficient $k^2$ can be sufficiently increased. For example, when used as a band-pass filter, an improvement of the filter property, particularly broadening of the bandwidth can be achieved. In addition, the insertion loss can be sufficiently reduced and the reflection coefficient of the IDT electrode can be increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention is clarified by describing specific preferred embodiments thereof with reference to the drawings.

Figure 1:
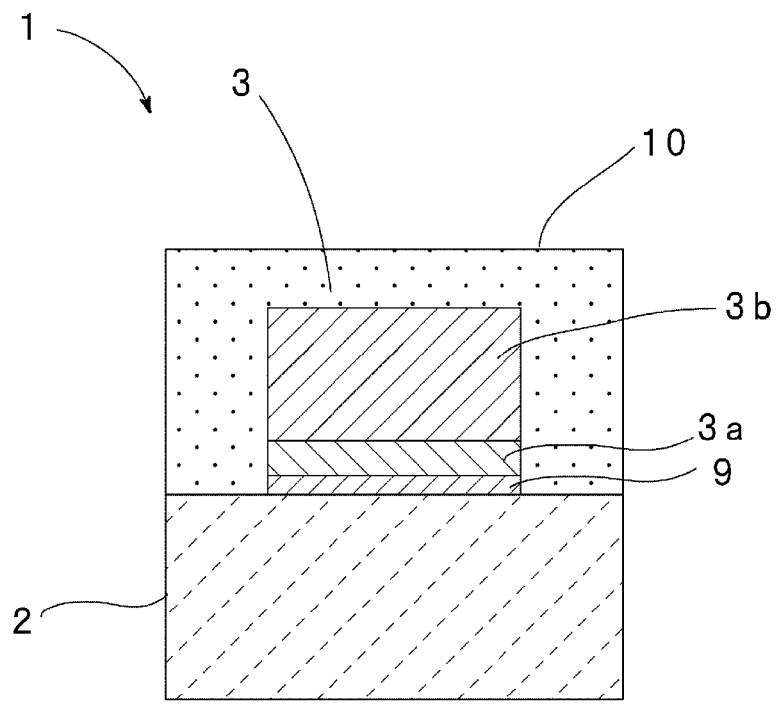
FIG. 1 is a schematic cross sectional view illustrating the electrode structure of a surface acoustic wave device according to a first preferred embodiment of the present invention.
Figure 2:
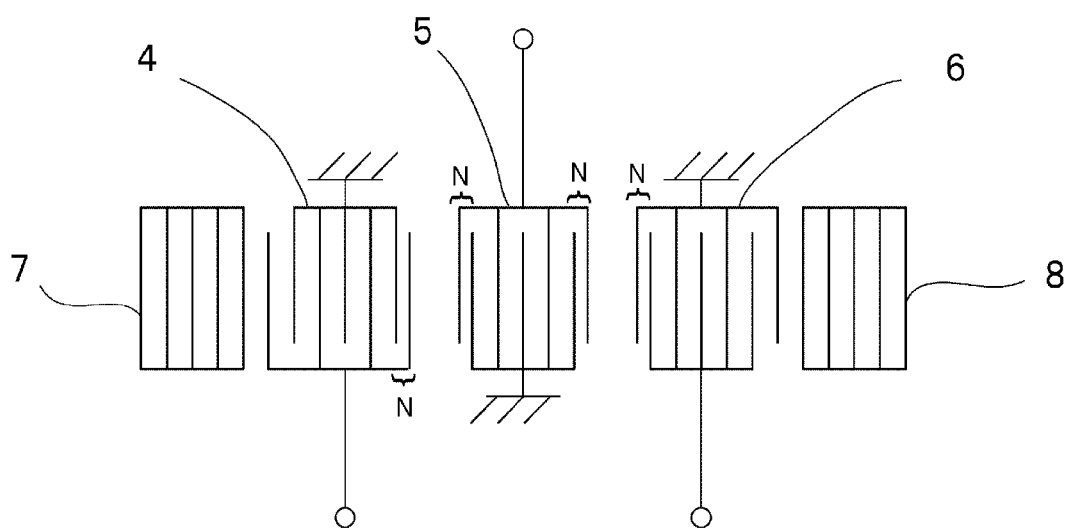
FIG. 2 is a plane view schematically illustrating a lower electrode structure in which a dielectric film is removed in the surface acoustic wave device according to the first preferred embodiment of the present invention.

FIG. 1 is a schematically cross sectional view of a surface acoustic wave device according to one preferred embodiment of the present invention. FIG. 2 is a schematic plan view illustrating the electrode structure thereof.

As illustrated in FIG. 1, the surface acoustic wave device 1 of this preferred embodiment includes a piezoelectric substrate 2. The piezoelectric substrate 2 preferably is a 44.5° Y—X $LiTaO_3$ substrate in this preferred embodiment. On the piezoelectric substrate 2, an electrode 3 is provided. As the electrode 3, the electrode structure illustrated in FIG. 2 is provided. More specifically, first to third IDT electrodes 4, 5, and 6 are arranged in the surface acoustic wave propagation direction. The IDT electrode 4, 5, or 6 includes electrode fingers which are interpolated to each other. At both sides of a region where the IDT electrodes 4 to 6 are arranged in the surface acoustic wave propagation direction, reflectors 7 and 8 are provided. Thus, a 3IDT type longitudinally coupled resonator type surface acoustic wave filter is provided.

In FIG. 1, one electrode finger of the IDT electrode 5 of the electrode structure is illustrated as a representative of the electrode 3 in order to show the cross-sectional structure.

The electrode 3 includes a laminated metal film in which a Pt film 3a and an Al film 3b are laminated in this order from the piezoelectric substrate side. When the wavelength determined based on the pitch of the IDT electrode 5 is defined as λ, the normalized film thickness h/λ of the Pt film 3a preferably is about 0.01 and the normalized film thickness h/λ of the Al film 3b preferably is about 0.07, for example.

Although it is not absolutely necessary, an adhesion layer 9 is preferably provided at a lower portion of a region where the electrode 3 is provided at the interface of the electrode 3 and the piezoelectric substrate 2. The adhesion layer 9 contains Ti and the normalized film thickness h/λ preferably is about 0.005, for example. The adhesion layer 9 is provided in order to firmly stick the electrode 3 to the piezoelectric substrate 2. The adhesion layer 9 may not be provided however. The adhesion layers 9 can be formed by appropriate materials capable of increasing the adhesion to the piezoelectric substrate 2 rather than the electrode 3, such as, Ti, Ni, NiCr, Cr, and Cu. When the electrode 3 in which a Cu film is located at a lower portion is used as in a modification described later, the adhesion layer 9 may be made of materials other than Cu.

Although the Pt film 3a is used as a lower electrode layer, another metal, such as Au, Ag, Cu, Ta, W, or Mo or an alloy containing the same-based may be used.

A dielectric layer 10 is arranged to cover the electrode 3. The dielectric layer 10 preferably contains $SiO_2$ in this preferred embodiment. When the wavelength determined based on the pitch of the IDT electrode 5 is defined as λ, the normalized film thickness h/λ of the $SiO_2$ film which is the dielectric layer 10 preferably is about 0.12. Silicon oxides other than $SiO_2$ may be used, and $SiO_xN_y$ or the like may be used in addition to silicon oxides. x and y of $SiO_xN_y$ are integers.

Although it is not absolutely necessary, in a portion where the IDT electrode 4 and the IDT electrode 5 are adjacent to each other and in a portion where the IDT electrode 5 and the IDT electrode 6 are adjacent to each other, the pitch of a plurality of electrode fingers at end portions of the IDT electrodes 4, 5, and 6 preferably is relatively narrower than the pitch of the remaining electrode fingers. The electrode finger portions with a relatively narrow pitch are referred to as a narrow pitch electrode finger portion N. In FIG. 2, the narrow pitch electrode finger portion N may not be provided however.

Some of the unique features of the surface acoustic wave device 1 of this preferred embodiment includes that a laminated structure of the Pt film 3a and the Al film 3b is used as typically illustrated in the electrode 3 in the electrode structure containing the IDT electrodes 4 to 6 and the reflectors 7 and 8 and that the normalized film thickness of the Pt film 3a, the normalized film thickness of the Al film 3b, and the normalized film thickness of the dielectric layer 10 preferably are controlled to have the above-mentioned specific values. Thus, the insertion loss can be sufficiently reduced and further the electromechanical coupling coefficient $k^2$ can be sufficiently increased. This is described based on specific experimental examples.

Figure 3:
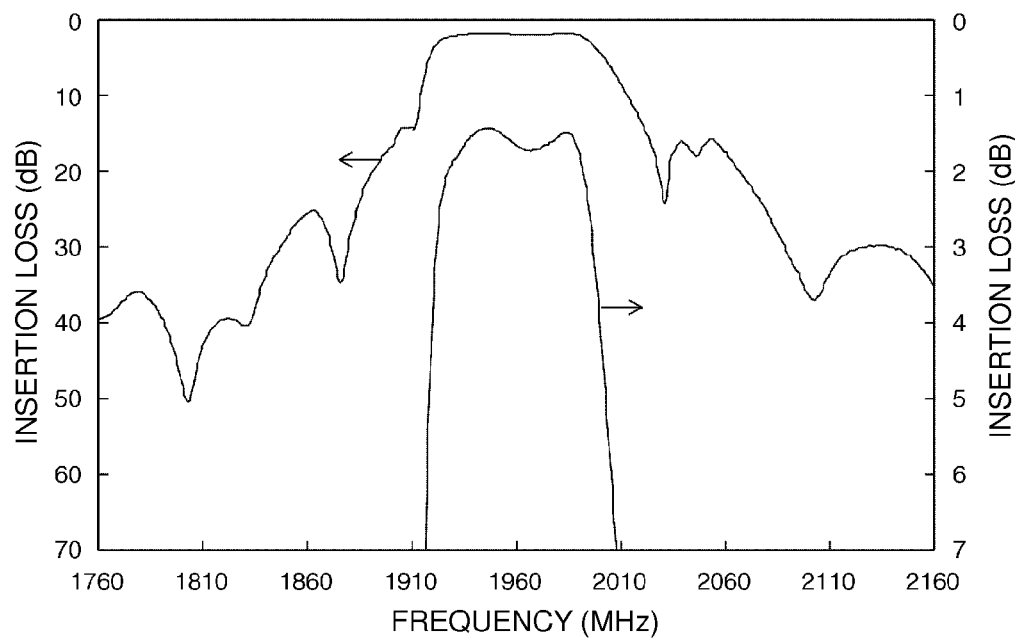
FIG. 3 is a view illustrating an attenuation characteristic of the surface acoustic wave device of one preferred embodiment of the present invention.

FIG. 3 is a view illustrating the attenuation characteristic of the surface acoustic wave device 1. The characteristics illustrated in FIG. 3 are characteristics when the IDT electrodes 4 to 6 and the reflectors 7 and 8 are designed as shown in Table 1.

TABLE 1

| | Reflector 7 | IDT electrode 4 | IDT electrode 5 | IDT electrode 6 | Reflector 8 |
|---|---|---|---|---|---|
| Number of pairs of electrode fingers | 60 | 16 | 30 | 16 | 60 |
| duty | 0.65 | 0.65 | 0.65 | 0.65 | 0.65 |

TABLE 1-continued

| | Reflector 7 | IDT electrode 4 | IDT electrode 5 | IDT electrode 6 | Reflector 8 |
|---|---|---|---|---|---|
| λ (μm) | 2.053 | 2.063 | 2.063 | 2.063 | 2.053 |
| Intersecting width | 68 λ | 68 λ | 68 λ | 68 λ | 68 λ |

As is clear from FIG. 3, the maximum insertion loss in a passband is about 1.4 dB, which shows that the insertion loss in a passband can be reduced. The frequency temperature coefficient TCF is about −26 ppm/° C., and the absolute value of the TCF can be reduced as compared with the value of the TCF of about −35 ppm/° C. in a common surface acoustic wave device in which an IDT electrode is formed on a $LiTaO_3$ substrate.

As described above, a reduction in the insertion loss in a passband can be achieved by controlling the normalized film thickness of each of the Pt film 3a and the Al film 3b and the normalized film thickness of the dielectric layer 10 to the above-mentioned specific values. This is described based on specific non-limiting experimental examples.

Figure 4:
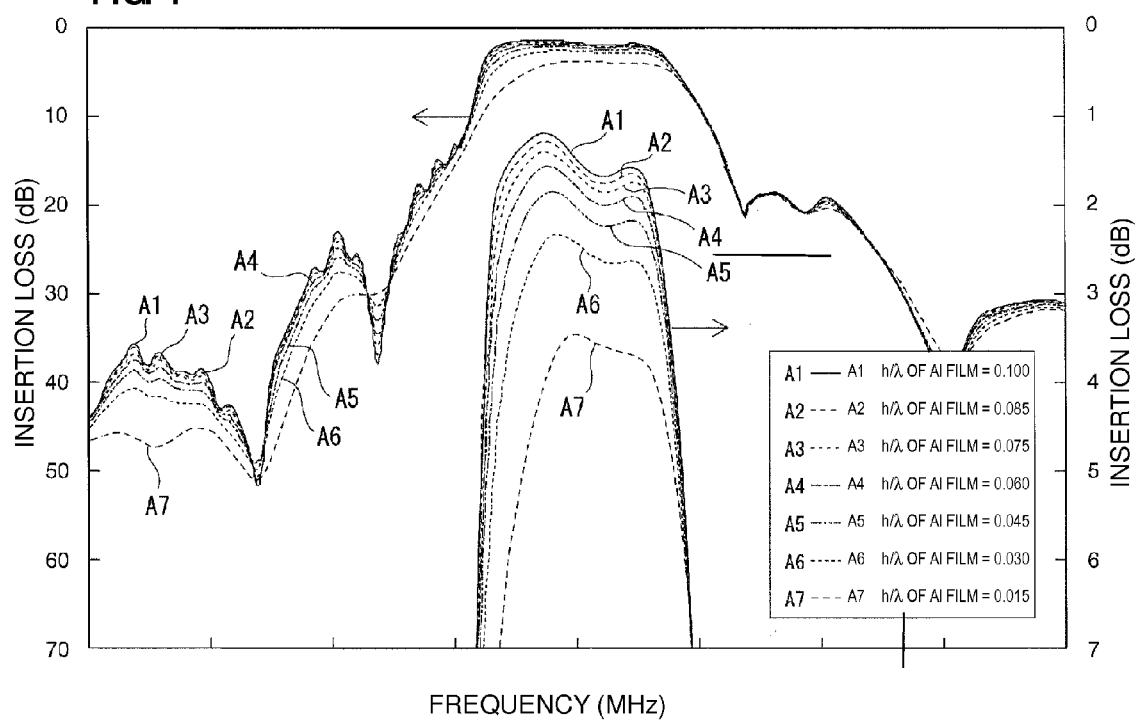
FIG. 4 is a view illustrating changes in the attenuation characteristic when changing normalized film thickness h/λ (%) of an Al film in an experimental example of the first preferred embodiment of the present invention.
Figure 5:
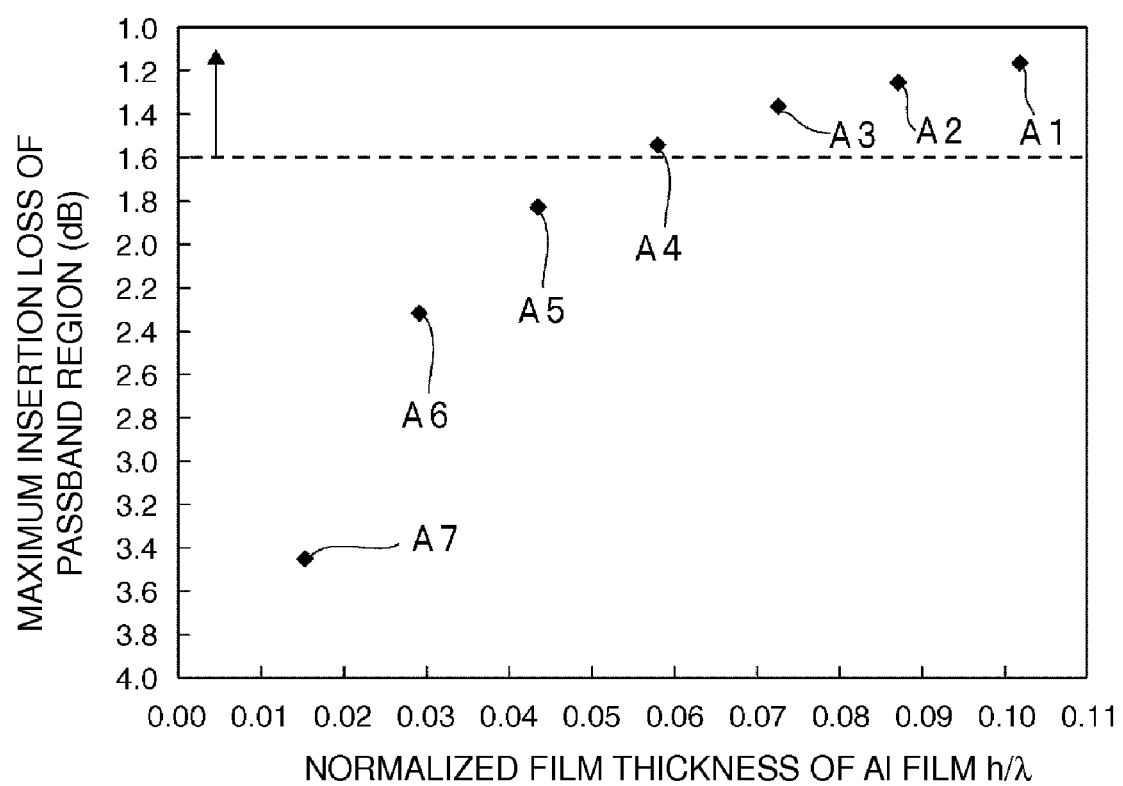
FIG. 5 is a view illustrating changes in the maximum loss of a passband when changing the normalized film thickness h/λ (%) of an Al film constituting an IDT electrode in the first preferred embodiment of the present invention.

FIG. 4 is a view illustrating the attenuation characteristic of each surface acoustic wave device when the normalized film thickness h/λ of the Al film 3b is controlled to be about 0.015, about 0.030, about 0.045, about 0.060, about 0.075, about 0.085, or about 0.100 similarly as in the preferred embodiment above. FIG. 5 is a view illustrating the relationship between the maximum insertion loss in a passband and the normalized film thickness h/λ of the Al film in a surface acoustic wave device when the normalized film thickness h/λ of the Al film 3b is controlled to be one of the values mentioned above. A1 to A7 of FIG. 5 correspond to A1 to A7 of FIG. 4.

As is clear from FIGS. 4 and 5, it was discovered that the maximum insertion loss in a passband becomes larger as the normalized film thickness h/λ of the Al film 3b is reduced. This is considered to be because the electrode finger resistance of the IDT electrode becomes large. Particularly, it was discovered that when the normalized film thickness h/λ of the Al film 3b becomes smaller than about 0.06, the maximum insertion loss in a passband is remarkably worsened and the degree of worsening of the maximum insertion loss increases to changes in the film thickness of the Al film. Therefore, it was discovered that the normalized film thickness h/λ of the Al film 3b should preferably be about 0.06 or more in order to obtain a good filter property.

Figure 6:
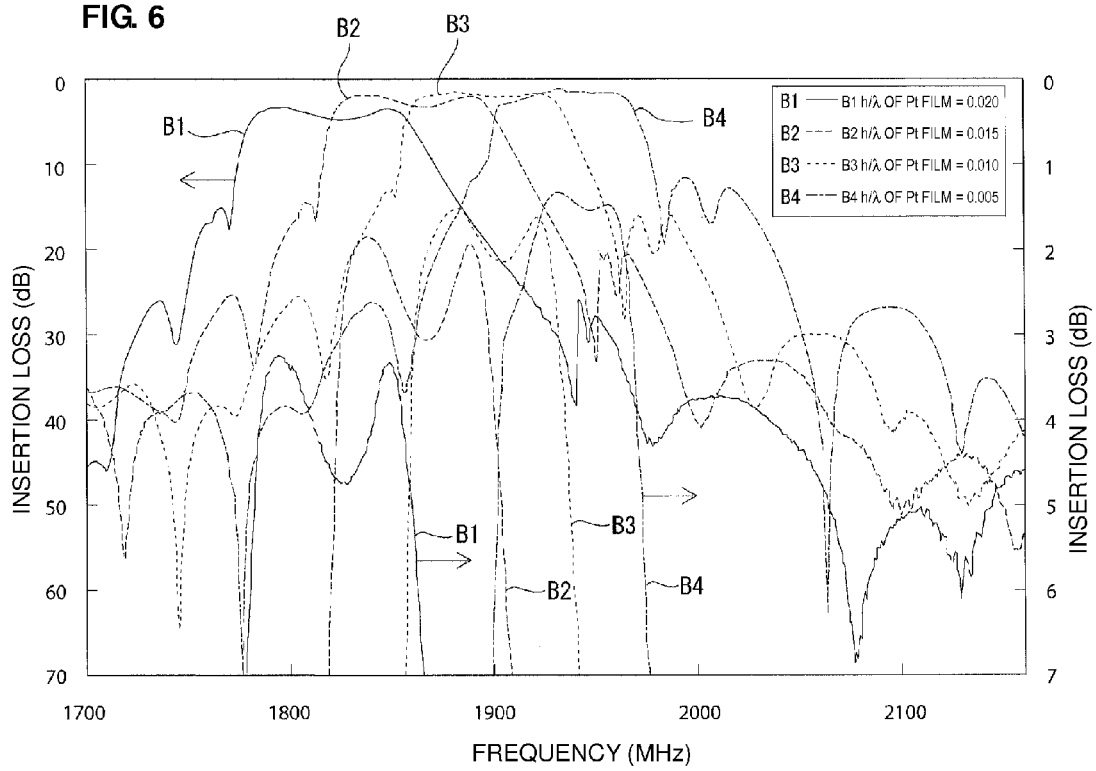
FIG. 6 is a view illustrating changes in the attenuation characteristic when changing the normalized film thickness h/λ (%) of Pt constituting an IDT electrode in a surface acoustic wave device of a second preferred embodiment of the present invention.
Figure 7:
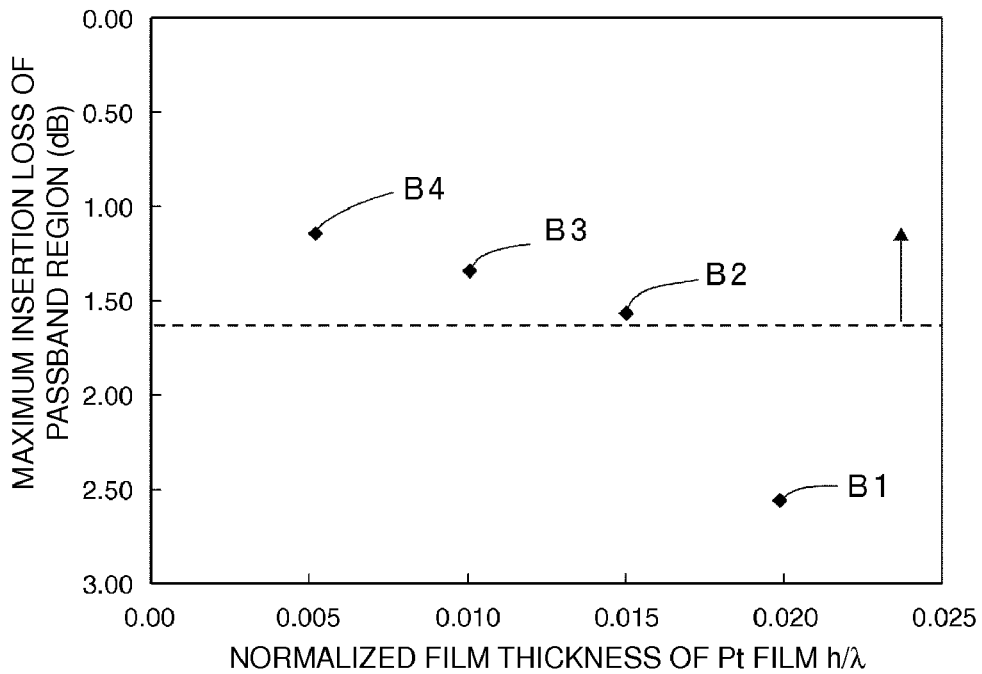
FIG. 7 is a view illustrating changes in the maximum loss in a passband when changing the normalized film thickness h/λ (%) of a Pt film constituting the IDT electrode in the second preferred embodiment of the present invention.
Figure 8:
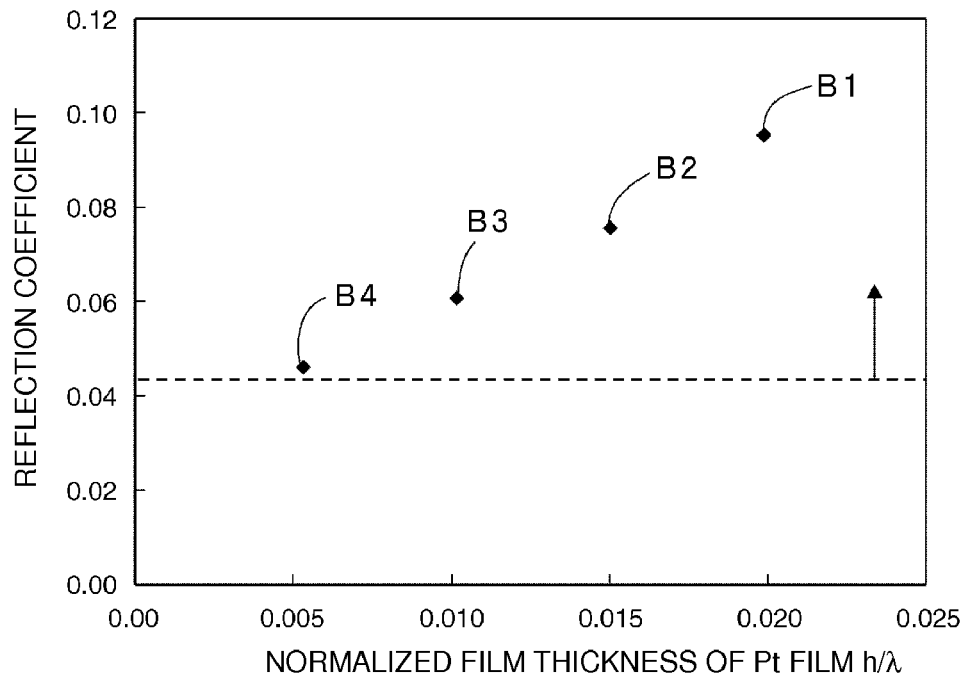
FIG. 8 is a view illustrating changes in the reflection coefficient when changing the normalized film thickness h/λ (%) of the Pt film constituting the IDT electrode in the second preferred embodiment of the present invention.

FIG. 6 is a view illustrating the attenuation characteristic of a surface acoustic wave device which is configured in the same manner as in the surface acoustic wave device of the preferred embodiment above and the normalized film thickness h/λ of the Pt film 3a is controlled to be about 0.005, about 0.010, about 0.015, or about 0.020. FIG. 7 is a view illustrating the relationship between the normalized film thickness h/λ of the Pt film 3a and the maximum insertion loss in a passband. FIG. 8 is a view illustrating the relationship between the normalized film thickness h/λ of the Pt film and the reflection coefficient. B1 to B4 of FIGS. 7 and 8 correspond to B1 to B4 of FIG. 6.

As is clear from FIGS. 6 and 7, it was discovered that when the normalized film thickness h/λ of the Pt film 3a becomes large, the maximum insertion loss in a passband becomes large. This is considered to be because the acoustic velocity of surface acoustic waves decrease, and thus the maximum insertion loss in a passband deteriorates. In particular, when the normalized film thickness h/λ of the Pt film 3a becomes larger than about 0.015, the maximum insertion loss in a passband remarkably deteriorates. Therefore, in order to obtain a good filter property, the normalized film thickness h/λ of the Pt film 3*a* should preferably be about 0.015 or lower.

In contrast, as is clear from FIG. 8, it was discovered that when the normalized film thickness h/λ of the Pt film 3*a* becomes small, the reflection coefficient decreases. When using a longitudinally coupled resonator type surface acoustic wave filter as a band-pass filter, the reflection coefficient of the electrode fingers should preferably be larger than about 0.04. Therefore, as is clear from FIG. 8, it was discovered that when the normalized film thickness h/λ of the Pt film is controlled to be about 0.005 or more, the reflection coefficient can be sufficiently increased. Therefore, it was discovered that, in order to obtain a good filter property, the normalized film thickness of the Pt film 3*a* may preferably be controlled in the range of about $0.005 \leq h/\lambda \leq$ about $0.015$.

Figure 9:
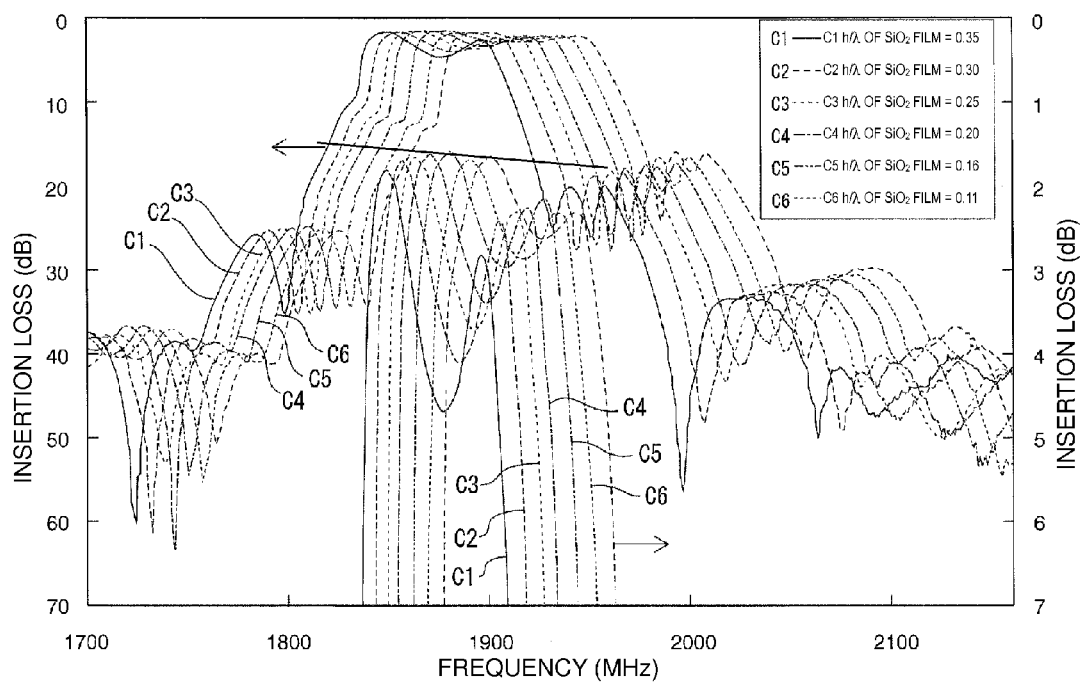
FIG. 9 is a view illustrating, in a surface acoustic wave device of a third preferred embodiment of the present invention, changes in the attenuation characteristic of the surface acoustic wave device when changing the normalized film thickness of $SiO_2$.
Figure 10:
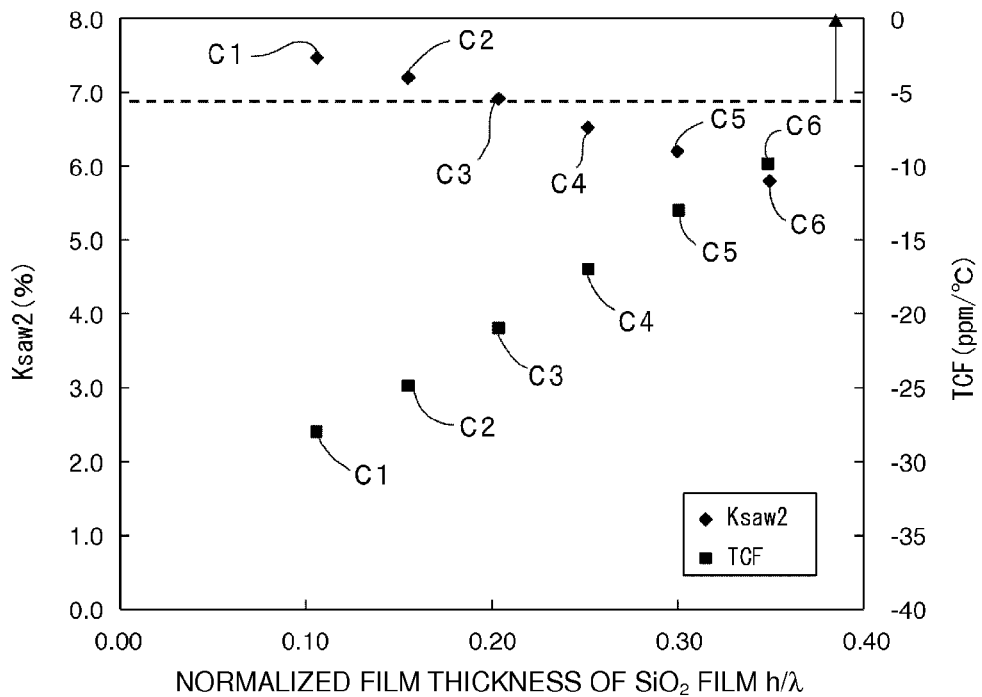
FIG. 10 is a view illustrating changes in the electromechanical coupling coefficient $k^2$% and the frequency temperature coefficient TCF when changing the normalized film thickness h/λ (%) of $SiO_2$ in the third preferred embodiment of the present invention.

FIG. 9 illustrates the attenuation characteristic of a surface acoustic wave device configured in the same manner as in the preferred embodiment above in which the normalized film thickness h/λ of the dielectric layer 10 containing $SiO_2$ is controlled to be about 0.11, about 0.16, about 0.20, about 0.25, about 0.30, or about 0.35. FIG. 10 is a view illustrating the relationship between the normalized film thickness h/λ of the $SiO_2$ film when the $SiO_2$ film is changed as described above, the electromechanical coupling coefficient $k^2$, and the frequency temperature coefficient TCF. C1 to C6 of FIG. 10 correspond to C1 to C6 of FIG. 9, respectively.

As is clear from FIG. 9, it was discovered that when particularly the normalized film thickness h/λ is increased by changing the normalized film thickness h/λ of $SiO_2$ film, the passband of the surface acoustic wave device shifts to a low-pass side and the bandwidth becomes a little narrow. This is because the electromechanical coupling coefficient $k^2$ becomes low as the normalized film thickness of $SiO_2$ film increases as illustrated in FIG. 10. As is clear from FIG. 10, it was discovered that when the normalized film thickness h/λ of the $SiO_2$ film exceeds about 0.20, a reduction degree of the electromechanical coupling coefficient becomes a little high. Therefore, in order to obtain a sufficiently high electromechanical coupling coefficient and a sufficient broad bandwidth, it is preferable that the normalized film thickness h/λ of the $SiO_2$ film is controlled to be about 0.20 or lower, and thus the electromechanical coupling coefficient $k^2$ is controlled to be higher than about 6.9% or more.

It was also discovered that when the normalized film thickness h/λ of the $SiO_2$ film becomes small, the absolute value of the frequency temperature coefficient TCF becomes high. This is because the frequency temperature coefficient TCF of the $SiO_2$ film is a positive value and the frequency temperature coefficient TCF of $LiTaO_3$ is a negative value, and therefore the effect of reducing the absolute value of TCF by laminating the $SiO_2$ film decreases due to a reduction in the normalized film thickness h/λ of the $SiO_2$ film. Therefore, although it is desirable to select the film thickness of the $SiO_2$ film in accordance with required temperature characteristics, the absolute value of the frequency temperature coefficient TCF can be made small by laminating the $SiO_2$ film as the dielectric layer 10 as compared with a surface acoustic wave device not having a $SiO_2$ film. More specifically, the temperature characteristics can be improved.

When the film thickness of the $SiO_2$ film becomes smaller than the film thickness of the IDT electrodes 4 to 6, a level difference arises, in the top surface of the $SiO_2$ film, between a portion where the IDT electrode is provided at a lower portion and a portion where the electrode is not provided. Therefore, there is a possibility that the loss increases or the frequency temperature characteristics deteriorate. Therefore, the film thickness of the $SiO_2$ film needs to be larger than the film thickness of the IDT electrode. As described above, when the normalized film thickness of the $SiO_2$ film is controlled to be about 0.2 or lower, due to the fact that the normalized film thickness of Pt is about 0.015 or lower, the normalized film thickness of Al should preferably be about 0.185 or lower.

As is clear from FIGS. 4 to 10, when the electrode 3 contains the Pt film 3*a* and the Al film 3*b*, the normalized film thickness of the Al film 3*b* should preferably be about 0.06 or more and about 0.185 or lower. The normalized film thickness of the Pt film 3*a* preferably is about 0.005 or more and about 0.015 or lower. It was discovered that a good filter property and good frequency temperature characteristics can be obtained by controlling the normalized film thickness h/λ of the dielectric layer 10 containing the $SiO_2$ film to be about 0.20 or lower.

Figure 11:
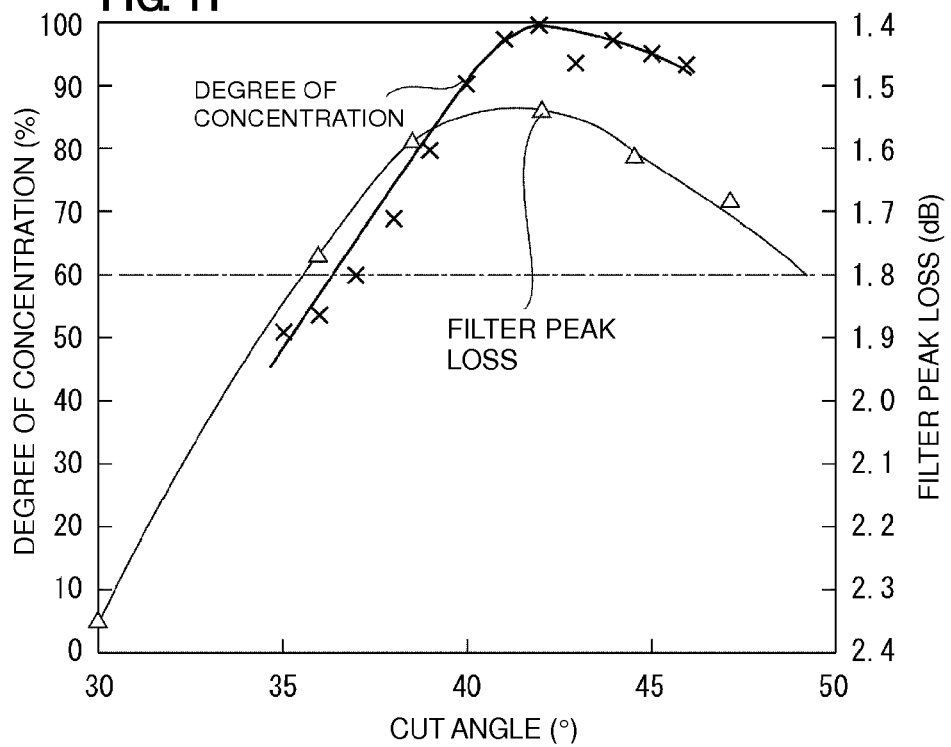
FIG. 11 is a view illustrating changes in the degree of concentration and the maximum loss in a passband when changing the cut angle of $LiTaO_3$ in the surface acoustic wave device of the third preferred embodiment of the present invention.
Figure 12:
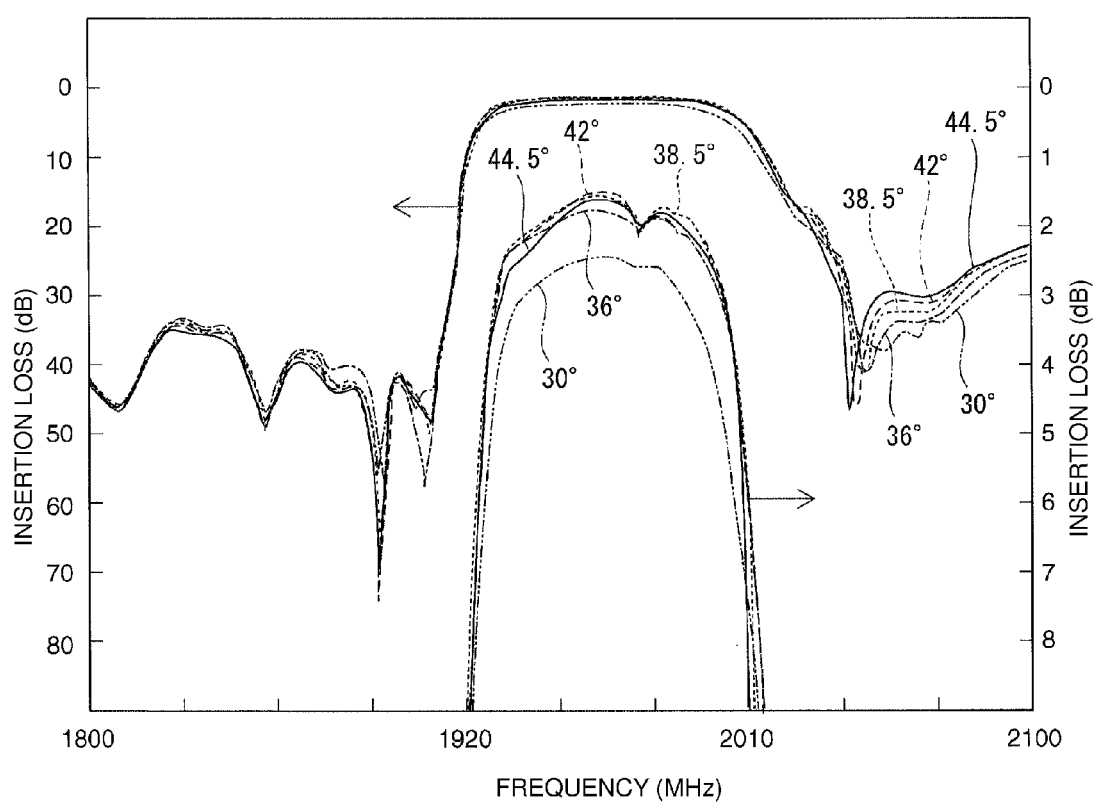
FIG. 12 is a view illustrating changes in the attenuation characteristic when changing the cut angle of $LiTaO_3$ in the surface acoustic wave device of the third preferred embodiment of the present invention.
Figure 13:
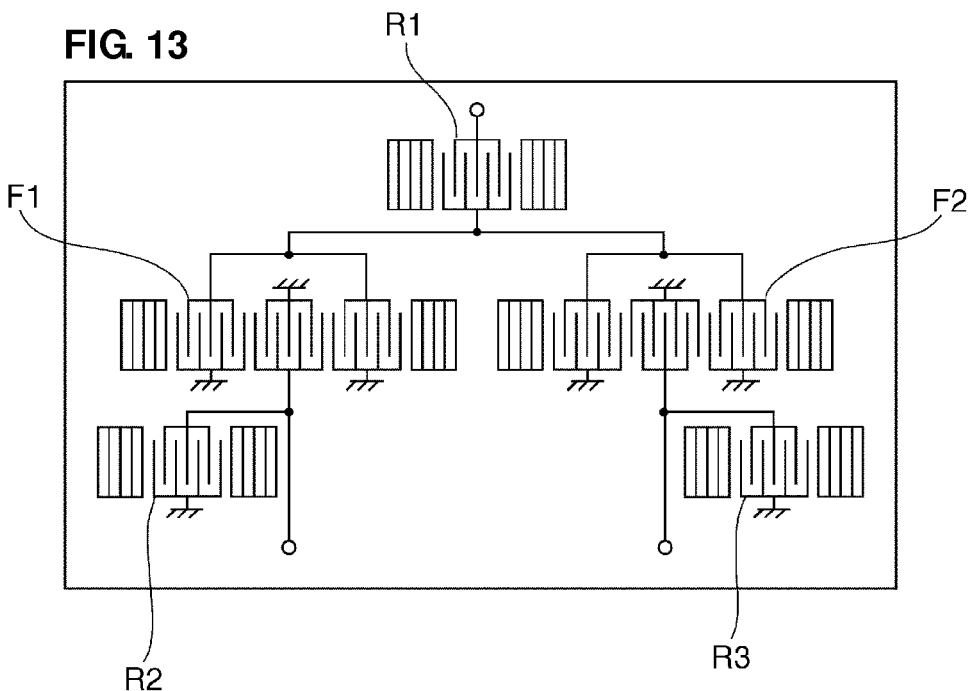
FIG. 13 is a schematic plan view illustrating the electrode structure of a surface acoustic wave device used for obtaining the characteristics illustrated in FIGS. 11 and 12.

FIG. 11 is a view illustrating the relationship between the cut angle when changing the cut angle of a $LiTaO_3$ substrate and the degree of concentration of surface acoustic waves and the maximum insertion loss in a passband in a surface acoustic wave device having the electrode structure illustrated in FIG. 13. FIG. 12 is a view illustrating the attenuation characteristic of the surface acoustic wave device when the cut angle of the $LiTaO_3$ substrate is changed. In the electrode structure of FIG. 13, surface acoustic wave resonators R1 to R3 preferably are 1 port type surface acoustic wave resonators. In the surface acoustic wave filters F1 and F2, the first to the third IDT electrodes are arranged in this order in the surface acoustic wave propagation direction. Reflectors are provided at both sides of a region where the first to the third IDT electrodes are arranged in the surface acoustic wave propagation direction. Thus, a 3IDT type longitudinally coupled resonator type surface acoustic wave filter is provided. In the first to the third IDT electrodes, narrow pitch electrode finger portions N1, N21, N23, and N3 in which the pitch of a plurality of electrode fingers at end portions is relatively narrower than the pitch of the remaining electrode fingers are provided in a portion where the IDT electrodes are adjacent to each other. In the surface acoustic wave device illustrated in FIG. 13, between an input port and output ports, the surface acoustic wave resonator R1 is connected to the input port in series and the surface acoustic wave filters F1 and F2 being connected to each other in parallel are connected to the surface acoustic wave resonator R1. Furthermore, the surface acoustic wave resonator R2 and the surface acoustic wave resonator R3 are connected between the node between the surface acoustic wave filter F1 and one of the output ports and the node between the surface acoustic wave filter F2 and the other output port and the ground, respectively. Thus, a surface acoustic wave filter having an unbalanced-balanced transforming function is provided. The design parameters of the structure of FIG. 13 are as follows.

TABLE 2

| Surface acoustic wave resonator R1 | | |
|---|---|---|
|  | IDT | Reflector |
| Intersecting width | 13.5 λ | 13.5 λ |
| Number of pairs of electrode fingers | 96.5 | 8.5 |

TABLE 2-continued

Surface acoustic wave resonator R1

|  | IDT | Reflector |
|---|---|---|
| λ (μm) | 1.933 | 1.933 |
| Duty | 0.58 | 0.58 |

TABLE 3

Surface acoustic wave resonators R2, R3

|  | IDT | Reflector |
|---|---|---|
| Intersecting width | 12.4 λ | 12.4 λ |
| Number of pairs of electrode fingers | 67 | 8.5 |
| λ (μm) | 2.018 | 2.018 |
| Duty | 0.56 | 0.56 |

TABLE 4

Surface acoustic wave filters F1 and F2

|  | First IDT electrode | N1 | N21 | Second IDT electrode | N23 | N3 | Third IDT electrode | Reflector |
|---|---|---|---|---|---|---|---|---|
| Intersecting width | 16.3 λ | 16.3 λ | 16.3 λ | 16.3 λ | 16.3 λ | 16.3 λ | 16.3 λ | 16.3 λ |
| Number of pairs of electrode fingers | 19.5 | 1 | 1 | 15 | 3 | 3.5 | 21.5 | 52.5 |
| λ (μm) | 1.995 | 1.807 | 1.817 | 1.954 | 1.881 | 1.905 | 1.993 | 2.007 |
| Duty | 0.68 | 0.67 | 0.67 | 0.68 | 0.67 | 0.67 | 0.68 | 0.68 |

N1 refers to a narrow pitch electrode finger portion in the first IDT electrode and N21 refers to a narrow pitch electrode finger portion at the first IDT electrode side in the second IDT electrode.

N23 refers to a narrow pitch electrode finger portion at the third IDT electrode side in the second IDT electrode and N3 refers to a narrow pitch electrode finger portion in the third IDT electrode.

As is clear from FIGS. 11 and 12, the maximum insertion loss in a passband reaches the lowest value when the cut angle is around 42° and the maximum insertion loss in a passband becomes higher as the cut angle becomes smaller than about 42° and becomes larger than about 42°. Moreover, it was discovered that the degree of concentration surface acoustic waves reaches the highest value when the cut angle is around 42° and the degree of concentration decreases as the cut angle is moves away from about 42°.

FIG. 11 shows that, in order to obtain a good filter property, i.e., in order to control the maximum insertion loss in a passband to be about 1.8 dB or lower, the cut angle may be controlled to be in the range of about 36° to about 49°. Therefore, in a preferred embodiment of the present invention, it was discovered that the cut angle is desirably controlled to be in the range of about 36° to about 49° when using the LiTaO$_3$ substrate as the piezoelectric substrate.

Figure 14:
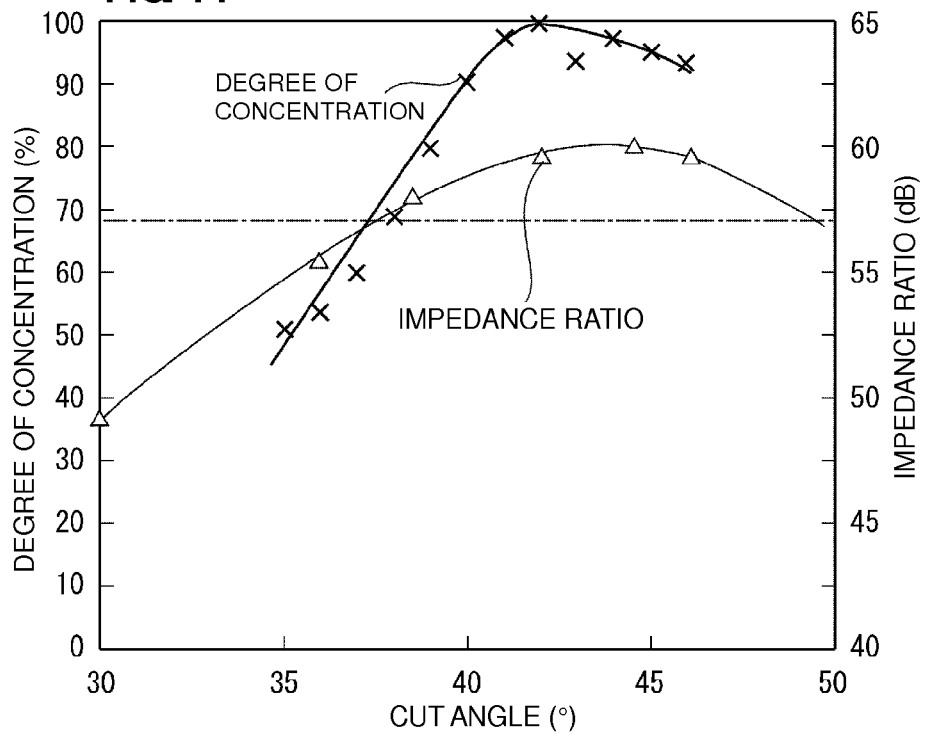
FIG. 14 is a view illustrating the relationship between the cut angle of a $LiTaO_3$ substrate and the degree of concentration of surface acoustic waves and the maximum insertion loss in a passband in a 1 port type surface acoustic wave resonator illustrated in FIG. 16.
Figure 15:
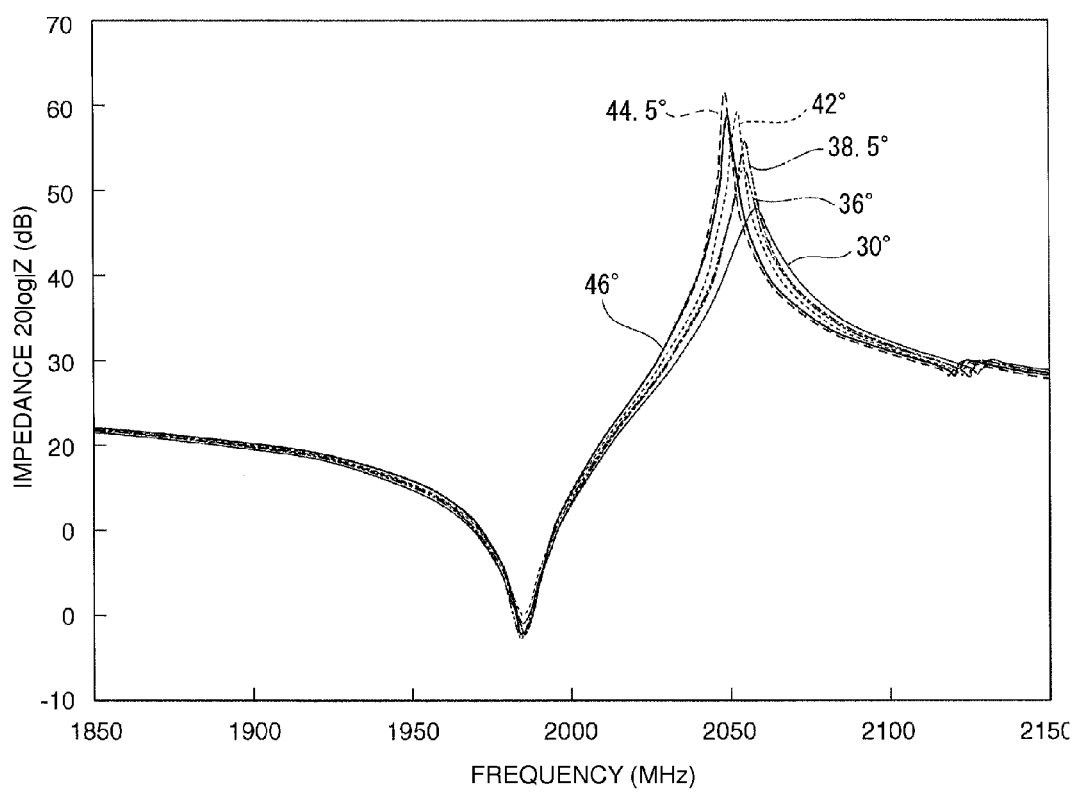
FIG. 15 is a view illustrating changes in the impedance characteristics when changing the cut angle of the $LiTaO_3$ substrate in the 1 port type surface acoustic wave resonator illustrated in FIG. 16.
Figure 16:
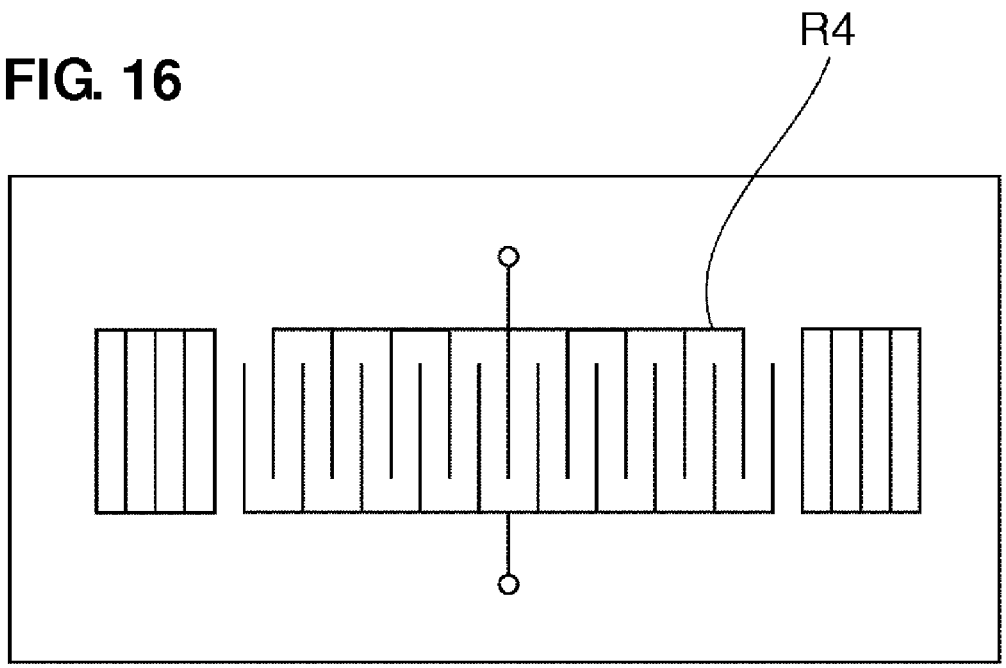
FIG. 16 is a schematic plan view illustrating the electrode structure of the 1 port type surface acoustic wave resonator used for obtaining the characteristics illustrated in FIG. 14 and FIG. 15.

FIG. 14 is a view illustrating the relationship between the cut angle and the degree of concentration of surface acoustic waves and the maximum insertion loss in a passband when changing the cut angle of the LiTaO$_3$ substrate in a 1 port type surface acoustic wave resonator R4 having the electrode structure illustrated in FIG. 16. FIG. 15 is a view illustrating the impedance characteristics of the surface acoustic wave resonator when changing the cut angle of the LiTaO$_3$ substrate. The design parameters of the structure illustrated in FIG. 16 are as follows.

TABLE 5

Surface acoustic wave resonator R4

|  | IDT | Reflector |
|---|---|---|
| Intersecting width | 12.4 λ | 12.4 λ |
| Number of pairs of electrode fingers | 67 | 8.5 |
| λ (μm) | 2.018 | 2.018 |
| Duty | 0.5 | 0.5 |

As is clear from FIGS. 14 and 15, the impedance characteristics become best when the cut angle is around 44.5° and the impedance characteristics deteriorate when the cut angle becomes smaller than about 44.5° and becomes larger than about 44.5°. Moreover, it was discovered that the degree of concentration reaches the highest value when the cut angle is around 42° and the degree of concentration of surface acoustic waves decreases as the cut angle moves away from about 42°.

Therefore, FIG. 14 and FIG. 15 show that, in order to obtain good impedance characteristics, i.e., in order to control impedance characteristics to be about 57 dB or more, the cut angle may be controlled to be in the range of about 38° to about 49°. Therefore, it was discovered that when a 1 port resonator is used as the surface acoustic wave device in a preferred embodiment of the present invention, the cut angle is desirably controlled to be in the range of about 38° to about 49° when the LiTaO$_3$ substrate is used as the piezoelectric substrate.

Also in the case where either an Au film, an Ag film, or a Cu film is used for the electrode 3, the effects of a preferred embodiment of the present invention are obtained when the Au film thickness, the Ag film thickness, and the Cu film thickness are controlled to be proportional to the electrode density of the Pt film.

Specifically, since the density of Pt is 21.45 kg/m$^3$ and the density of Au is 19.32 kg/m$^3$, the normalized film thickness range of Au equivalent to the normalized film thickness range of Pt of about $0.005 \leq h/\lambda \leq$ about 0.015 is about $0.0056 \leq h/\lambda \leq$ about 0.017.

Similarly, since the density of Ag is 10.5 kg/m$^3$, the normalized film thickness range of Ag is about $0.01 \leq h/\lambda \leq$ about 0.03. Since the density of Cu is 8.96 kg/m³, the normalized film thickness range of Cu is about $0.012 \leq h/\lambda \leq$ about 0.036.

In the preferred embodiment above, the 3IDT type longitudinally coupled resonator type surface acoustic wave filter and the 1 port type surface acoustic wave resonator are described but a 5IDT type longitudinally coupled resonator type surface acoustic wave filter or a structure in which a surface acoustic wave resonator is connected to a longitudinally coupled resonator type surface acoustic wave filter in series may be acceptable. Moreover, a ladder type filter using the 1 port type surface acoustic wave resonator may be acceptable.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave device, comprising:
   a piezoelectric substrate;
   an IDT electrode disposed on the piezoelectric substrate and including a Pt film and an Al film laminated on the Pt film; and
   a dielectric layer arranged to cover the IDT electrode on the piezoelectric substrate; wherein
   when a wavelength of a surface acoustic wave is defined as $\lambda$, a normalized film thickness $h/\lambda$ of the Al film is about $0.06 \leq h/\lambda \leq$ about 0.185, a normalized film thickness $h/\lambda$ of the Pt film is about $0.005\ h/\lambda \leq$ about 0.015, and a normalized film thickness $h/\lambda$ of the dielectric layer is the normalized film thickness of the IDT electrode $\leq h/\lambda$ about 0.2.

2. The surface acoustic wave device according to claim 1, wherein the piezoelectric substrate contains $LiTaO_3$ and the dielectric layer contains a silicon oxide.

3. The surface acoustic wave devices according to claim 2, wherein a cut angle of the $LiTaO_3$ is in a range of about 36° to about 49°.

4. A surface acoustic wave device, comprising:
   a piezoelectric substrate;
   an IDT electrode disposed on the piezoelectric substrate and including an Au film and an Al film laminated on the Au film; and
   a dielectric layer arranged to cover the IDT electrode on the piezoelectric substrate; wherein
   when a wavelength of a surface acoustic wave is defined as $\lambda$, a normalized film thickness $h/\lambda$ of the Al film is about $0.06 \leq h/\lambda \leq$ about 0.183, a normalized film thickness $h/\lambda$ of the Au film is about $0.0056\ h/\lambda \leq$ about 0.017, and a normalized film thickness $h/\lambda$ of the dielectric layer is the normalized film thickness of the IDT electrode $\leq h/\lambda \leq$ about 0.2.

5. The surface acoustic wave device according to claim 4, wherein the piezoelectric substrate contains $LiTaO_3$ and the dielectric layer contains a silicon oxide.

6. The surface acoustic wave devices according to claim 5, wherein a cut angle of the $LiTaO_3$ is in a range of about 36° to about 49°.

7. A surface acoustic wave device, comprising:
   a piezoelectric substrate;
   an IDT electrode disposed on the piezoelectric substrate and including an Ag film and an Al film laminated on the Ag film; and
   a dielectric layer arranged to cover the IDT electrode on the piezoelectric substrate; wherein
   when a wavelength of a surface acoustic wave is defined as $\lambda$, a normalized film thickness $h/\lambda$ of the Al film is about $0.06 \leq h/\lambda \leq$ about 0.17, a normalized film thickness $h/\lambda$ of the Ag film is about $0.01 \leq h/\lambda \leq$ about 0.03, and a normalized film thickness $h/\lambda$ of the dielectric layer is the normalized film thickness of the IDT electrode $\leq h/\lambda \leq$ about 0.2.

8. The surface acoustic wave device according to claim 7, wherein the piezoelectric substrate contains $LiTaO_3$ and the dielectric layer contains a silicon oxide.

9. The surface acoustic wave devices according to claim 8, wherein a cut angle of the $LiTaO_3$ is in a range of about 36° to about 49°.

10. A surface acoustic wave device, comprising:
    a piezoelectric substrate;
    an IDT electrode disposed on the piezoelectric substrate and including a Cu film and an Al film laminated on the Cu film; and
    a dielectric layer arranged to cover the IDT electrode on the piezoelectric substrate; wherein
    when a wavelength of a surface acoustic wave is defined as $\lambda$, a normalized film thickness $h/\lambda$ of the Al film is about $0.06 \leq h/\lambda \leq$ about 0.164, a normalized film thickness $h/\lambda$ of the Cu film is about $0.012 \leq h/\lambda \leq$ about 0.036, and a normalized film thickness $h/\lambda$ of the dielectric layer is the normalized film thickness of the IDT electrode $\leq h/\lambda \leq$ about 0.2.

11. The surface acoustic wave device according to claim 10, wherein the piezoelectric substrate contains $LiTaO_3$ and the dielectric layer contains a silicon oxide.

12. The surface acoustic wave devices according to claim 11, wherein a cut angle of the $LiTaO_3$ is in a range of about 36° to about 49°.

* * * * *